(12) United States Patent
Conboy et al.

(10) Patent No.: US 6,449,522 B1
(45) Date of Patent: Sep. 10, 2002

(54) MANAGING A SEMICONDUCTOR FABRICATION FACILITY USING WAFER LOT AND CASSETTE ATTRIBUTES

(75) Inventors: Michael R. Conboy, Austin; Patrick J. Ryan, Kyle; Elfido Coss, Jr., Austin, all of TX (US)

(73) Assignee: Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/193,349

(22) Filed: Nov. 17, 1998

(51) Int. Cl.[7] .............................................. G06F 19/00
(52) U.S. Cl. ..................... 700/121; 700/99; 700/100; 700/117; 700/112; 700/115; 700/214; 438/9; 438/14; 438/17; 438/689; 414/935; 414/937; 414/940; 414/217
(58) Field of Search ................... 700/95–96, 99–100, 700/108–110, 112, 113, 114, 115, 116, 117, 121, 213–214, 219, 222, 223, 226, 228; 414/935–937, 222.13, 416.03, 940, 217; 438/14, 9, 17, 689, 758, 908; 29/25.01

(56) References Cited

U.S. PATENT DOCUMENTS

| | | | | | |
|---|---|---|---|---|---|
| 5,373,451 A | * | 12/1994 | Furukawa | ................... | 700/228 |
| 5,603,777 A | * | 2/1997 | Ohashi | ...................... | 134/25.4 |
| 5,820,679 A | * | 10/1998 | Yokoyama et al. | ......... | 118/719 |
| 5,993,041 A | * | 11/1999 | Toba | ............................ | 700/99 |
| 6,073,501 A | * | 6/2000 | Rohner | ...................... | 73/865.8 |
| 6,112,130 A | * | 8/2000 | Fukuda et al. | .............. | 700/121 |
| 6,128,588 A | * | 10/2000 | Chacon | ........................ | 703/6 |

* cited by examiner

*Primary Examiner*—Ramesh Patel

(57) ABSTRACT

Systems and methods for managing automated material handling systems, such as semiconductor fabrication facilities, using material item (e.g., wafer lot) attributes and cassette attributes are provided. A semiconductor fabrication facility typically includes multiple wafer lots and multiple cassettes for storing the wafer lots. A system and method, in one embodiment of the invention, includes setting one or more lot attributes for each wafer lot, setting one or more cassette attributes for each cassette, and selecting a particular cassette for holding a particular wafer lot based on the one or more wafer lot attributes of the particular wafer lot and the one or more cassette attributes of the particular cassette. The wafer lot and cassette attributes may, for example, include an attribute identifying a position in a fabrication sequence and one or more attributes indicative of one or more contaminants. By selecting cassettes in this manner, wafer lots and cassettes may, for example, be classified or logically zoned.

33 Claims, 4 Drawing Sheets

MANAGING A SEMICONDUCTOR FABRICATION FACILITY USING WAFER LOT AND CASSETTE ATTRIBUTES

FIELD OF THE INVENTION

The present invention generally relates to semiconductor fabrication and, more particularly, to systems and methods for managing a semiconductor fabrication facility using wafer lot attributes and cassette attributes.

BACKGROUND OF THE INVENTION

Semiconductor manufactures compete in a highly competitive and capital-intensive industry. A state-of-the-art semiconductor fabrication plant typically includes hundreds of different fabrication tools and can cost $1 billion or more. New plants can also become obsolete relatively quickly as the dimensions of semiconductor devices decrease.

A conventional semiconductor fabrication plant typically includes multiple fabrication areas or bays interconnected by a path, such as a conveyor belt. Each bay generally includes the requisite fabrication tools (interconnected by a subpath) to process semiconductor wafers for a particular purpose, such as photolithography, chemical-mechanical polishing, or chemical vapor deposition, for example. Material stockers or stocking tools generally lie about the plant and store semiconductor wafers waiting to be processed. The wafers are typically stored in containers, such as cassettes each of which can hold up to 25 wafers. Each material stocker typically services two or more bays and can hold hundreds of cassettes. While not shown, the semiconductor fabrication plant, including the bays, material stockers and the interconnecting path, typically operates under control of a distributed computer system running a factory management program, such as WorkStream Open sold by Consilium, Inc.

A typical semiconductor fabrication plant, such as the one described above, handles the processing of thousands of wafers at any given time. The wafers are typically divided into lots which undergo different processing sequences. In some instances, as a result of the different process sequences running simultaneously, certain wafer lots may become incompatible with others. For example, wafer lots exposed to a material, such as copper or cobalt, are typically desired to be separated from other lots within the plant. Conventional semiconductor fabrication facilities handle these "contaminated" wafers by physical separation. That is, physical barriers are created between areas in the facility and cassettes are bound to a designated area so as to avoid cross-contamination. When a wafer lot moves from one area to a new, physically separated area, a cassette from the new area receives the lot for processing in the new area. In this manner, conventional fabrication plants strive to separate contaminated wafer lots from lots incompatible therewith.

To generate higher revenues, semiconductor manufactures continually seek to increase to the throughput and yield of semiconductor wafers and find systems and methodologies which increase either of these parameters to be highly desirable.

SUMMARY OF THE INVENTION

The present invention generally provides techniques for managing automated material handling systems, such as semiconductor fabrication facilities, using material attributes and cassette attributes. These techniques may, for example, significantly increase the throughput of material through these systems.

A process and system for managing a semiconductor fabrication facility having multiple wafer lots and multiple cassettes for holding the wafer lots, in accordance with one embodiment of the invention, includes setting one or more lot attributes for each wafer lot, setting one or more cassette attributes for each cassette, and selecting a particular cassette for holding a particular wafer lot based on the one or more wafer lot attributes of the particular wafer lot and the one or more cassette attributes of the particular cassette. The wafer lot and cassette attributes may, for example, include an attribute identifying a position in a fabrication sequence and one or more attributes indicative of one or more contaminants. By selecting cassettes in this manner, wafer lots and cassettes may, for example, be classified or logically zoned.

The above summary of the present invention is not intended to describe each illustrated embodiment or every implementation of the present invention. The figures in the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
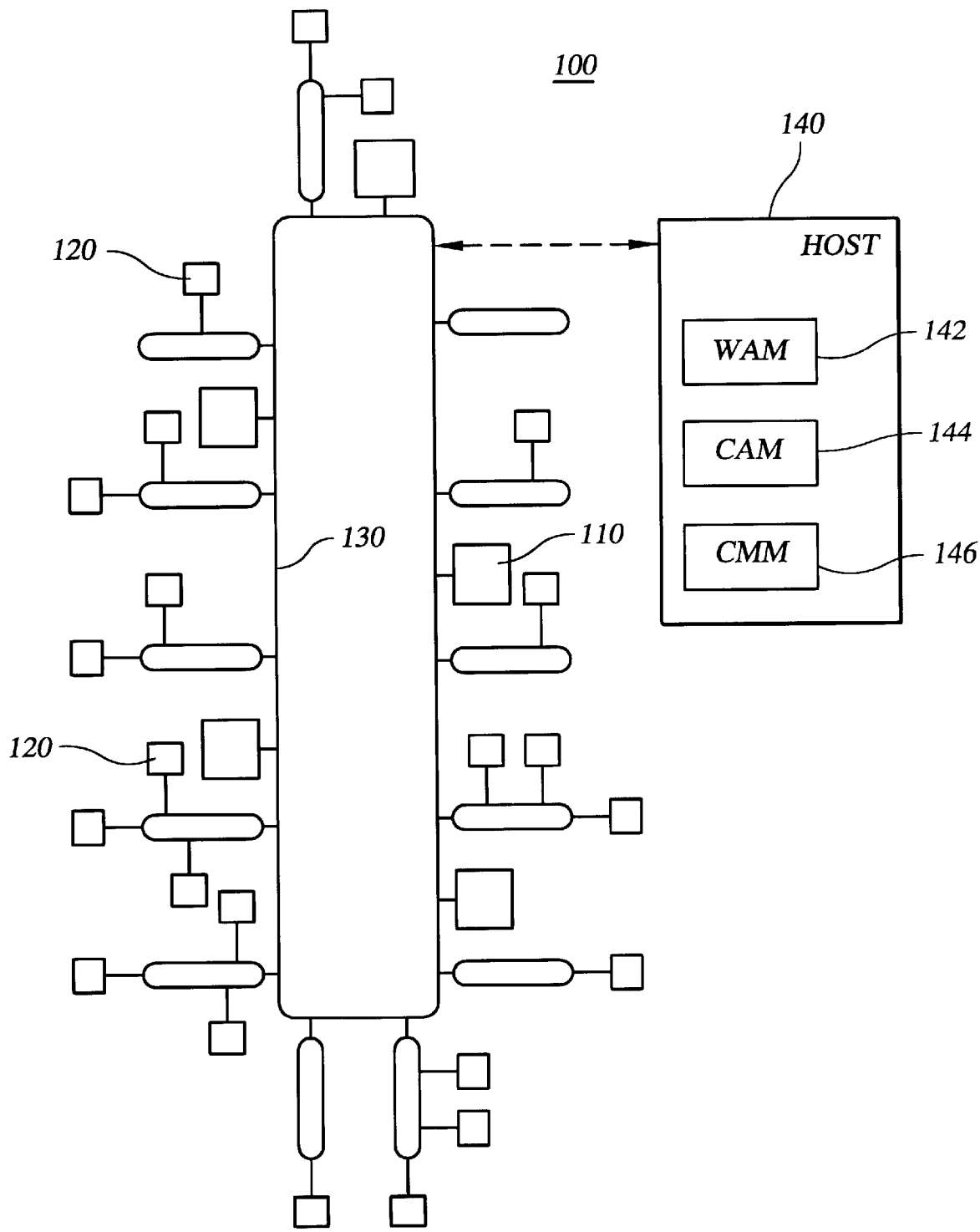
FIG. 1 illustrates an exemplary semiconductor fabrication facility in accordance with one embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention generally provides techniques for managing automated material handling facilities using attributes of the material items and attributes of cassettes which carry the material items. The invention is particularly suited for managing a semiconductor fabrication facility using wafer lot attributes and cassette attributes. While the present invention is not so limited, a better understanding of the invention will be found by reading the detailed description and exemplary embodiments which follow.

FIG. 1 illustrates an exemplary semiconductor fabrication facility in accordance with an illustrative embodiment of the invention. The semiconductor fabrication facility 100 generally includes multiple stocking tools or stockers 110 and multiple fabrication tools 120, connected by one or more paths 130 and operating under control of a host system 140, typically a computer system running a factory management program, such as WorkStream Open. The fabrication and stocker tools and path(s) each typically include or are associated with a computer system which locally controls the operation of the tool or path and which communicates with the host system 140.

A number of different fabrication tools may be provided for fabricating wafers. While not exhaustive, such fabrication tools include, deposition chambers, polishing tools, photolithography tools, for example. The facility further includes a number of wafers and a number of cassettes for storing wafers processed in the facility. During processing, the wafers are typically divided into lots or groupings of one or more wafers. A cassette may be used to store one or more lots. Each cassette and wafer or wafer lot typically includes an identification tag, such as a bar code, which may be read by each tool and/or path for identifying the cassette and wafer or wafer lot.

In accordance with the invention, the host system 140 includes a wafer attribute module (WAM) 142 which manages attributes of wafer lots as they move through a fabrication sequence. The term fabrication sequence refers to series of process steps under which a wafer lot undergoes during fabrication. As should be appreciated, a given wafer lot undergoes a number of events during its fabrication sequence. Such events include, for example, dopant implants, various dielectric and metal deposition steps, polishing steps, storage in stockers, transfers between cassettes and so forth. The wafer attribute module 142 generally stores and updates attributes of wafer lots as the lots undergo events during fabrication, as will be discussed below.

The host system 140 also includes a cassette attribute module (CAM) 144 which manages attributes of cassettes used in the fabrication process. The cassette attribute module 144 generally stores and updates cassette attributes, as will also be discussed further below. The lot attributes for each wafer and the cassette attributes for each cassette are typically stored in a memory arrangement, such as a database, and maintained by the respective module, WAM or CAM. A cassette management module (CMM) 146 is also provided. The cassette management module 146 generally receives requests for cassettes and selects cassettes for storing wafer lots based on wafer lot attributes and cassette attributes. Using these attributes, the cassette management module 146 can logically or virtually zone wafers and/or cassettes with particular attributes. This can reduce or eliminate the need for physical separation and improve manufacturing throughput and reliability.

The host system 140 and modules 142–146 may be implemented in a number of different manners. The implementation of the modules 142–146 as subcomponents of the host system 140 is provided by way of illustration only. One or more of the modules 142–146 may, alternatively, be implemented as a stand alone module which interfaces with the host system 140. The cassette management module 146 may also be implemented in an agent scheme with an agent being associated with each wafer lot. In this case, a cassette management agent associated with a lot may select cassettes for the lot based on attributes of the lot and cassette attributes. A number of other implementations techniques will be readily understood by one skilled in the art upon reading the description which follows.

Cassette attributes and lot attributes can vary depending on the fabrication processes employed as well as the desired level of virtual zoning. For purpose of illustration and not of limitation, exemplary attributes which may be employed in a semiconductor facility will now be discussed. It should be appreciated that these attributes are exemplary and may or may not be used in a given environment.

The wafer lots may have one or more attributes based on position of a wafer lot in its fabrication sequence. For example, a fabrication sequence may be divided into to zones: FEOL (Front-End-Of-Line) and BEOL (Back-End-Of-Line). The dividing line between the two zones may, for example, be the first metal deposition step, typically a pre-silicidation metal deposition. Wafer lots undergoing operations pre-first metal deposition would have an FEOL attribute, while those post-metal deposition would have a BEOL attribute. The wafer lots may also have one or more attributes based on the lot's exposure to a contaminant. For example, lot attributes may be provided with an attribute which indicates whether or not the lot has been exposed to copper or cobalt. Another lot attribute which may be provided is a test/product lot attribute which signifies whether a lot is a test or product lot. Additional lot attributes may be provided to further classify wafer lots.

For purposes of the discussion which follows, the following fields will be used to illustrate wafer lot attributes:

| Field 1 | Field 2 | Field 3 |
|---------|---------|---------|
| FEOL/BEOL | copper | cobalt | where FEOL/BEOL (F/B)=1 indicates FEOL and F/B=0 indicates BEOL, copper=0 indicates non-copper contaminated and copper=1 indicates copper contaminated, and cobalt=0 indicates non-cobalt contaminated and cobalt=1 indicates cobalt contaminated. Other wafer lot attributes may be provided for further classification, if desired. Moreover, additional wafer lot attributes may be provided and used by the host system for purposes other than zoning.

| Field 1 | Field 2 | Field 3 |
|---------|---------|---------|
| F/B | copper | cobalt | where F/B=1 indicates FEOL and F/B=0 indicates BEOL, copper=0 indicates non-copper contaminated and copper=1 indicates copper contaminated, and cobalt=0 indicates non-cobalt contaminated and cobalt=1 indicates cobalt contaminated. Cassettes may also be provided with additional attributes such as a Clean/Dirty attribute for indicating whether a cassette is dirty or clean and a Last Clean attribute for indicating the last time a cassette was cleaned.

Figure 2:
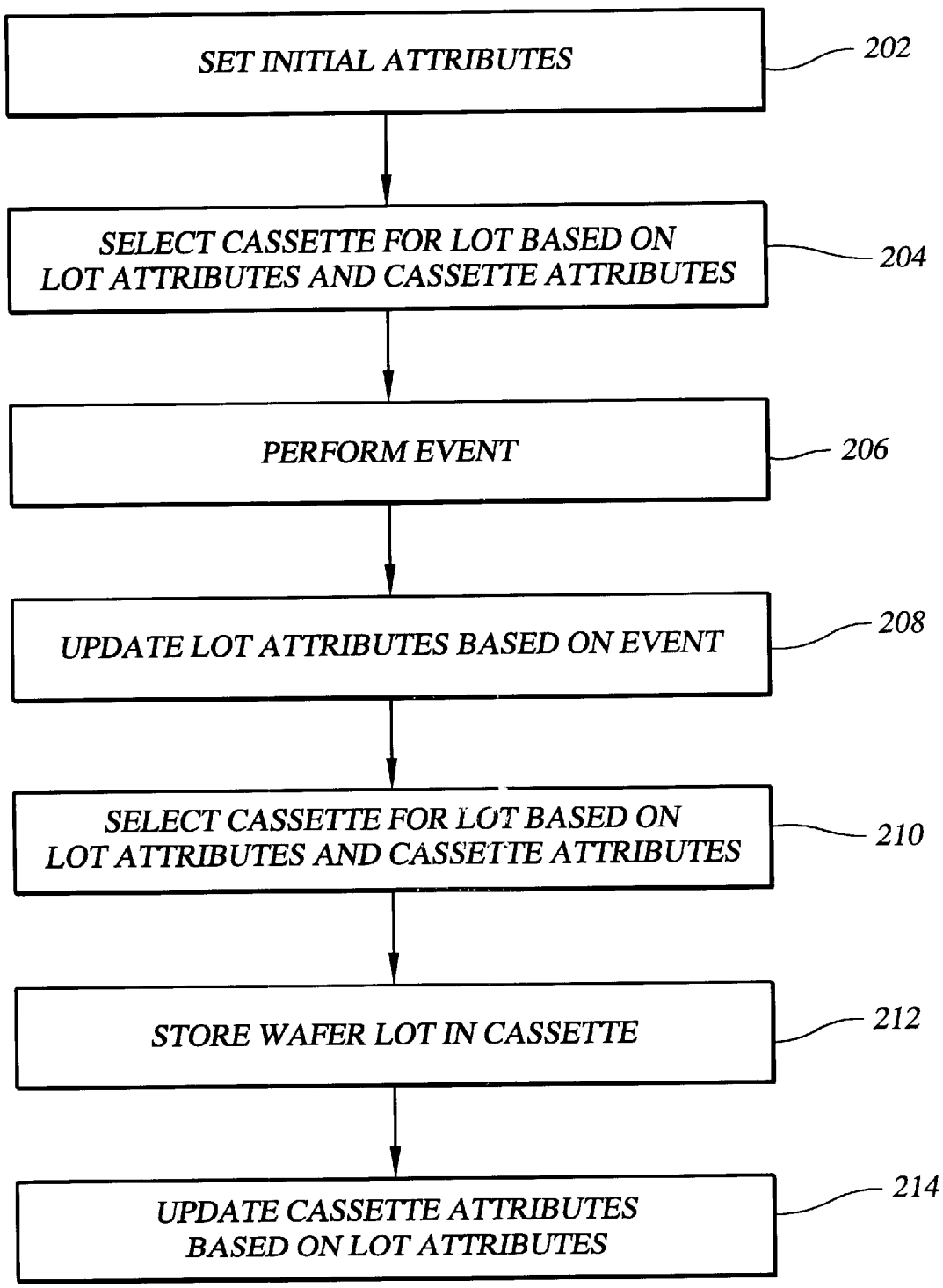
FIG. 2 illustrates an exemplary process in accordance with one embodiment of the invention.

FIG. 2 is a flow chart illustrating an exemplary process for managing a semiconductor fabrication facility using wafer lot attributes and cassette attributes. At the start of a lot's fabrication sequence, the wafer lot attributes for each wafer lot are initially set by a wafer attribute module or a system operator and stored in a memory arrangement, as indicated at block 202. This initial setting is typically a default setting. In the illustrated embodiment, the initial lot attribute setting may be F/B=1, copper=0, cobalt=0 or (1,0,0).

Next, a cassette management module selects a particular cassette for storing the wafer lot based on the attributes of the cassette and the attributes of the wafer lot, as indicated at block 204. Typically, this includes retrieving the attributes of the wafer lot, determining acceptable cassette type(s) for the wafer lot, and selecting a particular cassette of an acceptable type. The cassette management module may determine acceptable cassette types using rules which define acceptable cassette attributes for a wafer lot based on the attributes of the wafer lot. The rules may be implemented in a variety of manners, including the use of an algorithm or a map. Table 1 below illustrates an exemplary set of rules for selecting a cassette. The cassette management module then selects a particular cassette of an acceptable type for the wafer lot based on the acceptable cassette types for the lot and the preferred order of acceptable types, if any. The cassette management module may also take into account the relative location of a cassette and the number of cassettes of a particular type when selecting from more than one acceptable type.

TABLE 1

| Lot Attributes | 1st Acceptable Cassette Type | 2nd Acceptable Cassette Type | 3rd Acceptable Cassette Type |
|---|---|---|---|
| 1, 0, 0 (FEOL lot) | 1, 0, 0 (FEOL cassette) | | |
| 0, 0, 0 (Generic BEOL lot) | 0, 0, 0 (Generic BEOL cassette) | 1, 0, 0 (FEOL cassette) | |
| 0, 1, 0 (BEOL copper lot) | 0, 1, 0 (BEOL copper cassette) | 0, 0, 0 (Generic BEOL cassette) | 1, 0, 0 (FEOL cassette) |
| 0, 0, 1 (BEOL cobalt lot) | 0, 0, 1 (BEOL cobalt cassette) | 0, 0, 0 (Generic BEOL cassette) | 1, 0, 0 (FEOL cassette) |

Table 1 illustrates, by way of example, acceptable cassette types for wafer lot attributes and the preferred order of cassette types. For example, for an FEOL type lot (row 1), only FEOL type cassettes (1,0,0) are typically selected. For a generic BEOL lot, (row 2), either a generic BEOL type cassette (preferred) or an FEOL type cassette is typically selected. For a BEOL copper wafer lot (row 3), a BEOL copper type cassette (0,1,0) is preferred followed by a generic BEOL type cassette (0,0,0) then an FEOL type cassette (1,0,0). Similar preferences are defined for BEOL cobalt wafer lots (row 4). Accordingly, at step 204, the cassette management module typically selects an FEOL cassette.

Block 206 represents performing an event on the wafer lot. This typically includes transferring the wafer lot from the selected cassette to a tool and performing the event. As noted above, a number of different events may be performed on a wafer lot during fabrication. Such events include, for example, fabrication processing in a fabrication tool (e.g., metal deposition in a deposition chamber, polishing in a polishing tool, photolithography and etch, etc.) or storage in a stocker. This step may done under control of a host system using known techniques.

At block 208, the wafer attribute module selectively updates the attributes of the wafer lot based on the event. Selectively updating typically includes changing or maintaining attributes stored in memory based on the event. For example, if an FEOL wafer lot undergoes a BEOL event, a BEOL attribute is applied to the wafer lot. If a generic BEOL wafer lot undergoes a copper deposition, the copper attribute is set. On the other hand, if an FEOL lot undergoes an FEOL event, the attributes of the lot will be maintained. Table 2 below, while not exhaustive, illustrates exemplary lot attribute updates and events which may trigger the update.

TABLE 2

| Initial Lot Attributes | Event | Final Lot Attributes |
|---|---|---|
| 1, 0, 0 (FEOL lot) | BEOL event | 0, 0, 0 (Generic BEOL lot) |
| 0, 0, 0 (Generic BEOL lot) | copper event | 0, 1, 0 (BEOL copper lot) |
| 0, 0, 0 (Generic BEOL lot) | cobalt event | 0, 0, 1 (BEOL cobalt lot) |
| 0, 1, 0 (BEOL copper lot | copper encapsulation | 0, 0, 0 (Generic BEOL lot) |

TABLE 2-continued

| Initial Lot Attributes | Event | Final Lot Attributes |
|---|---|---|
| 0, 0, 1 (BEOL cobalt lot) | cobalt encapsulation | 0, 0, 0 (Generic BEOL lot) |

BEOL events include undergoing a BEOL process (e.g., first metal deposition). Copper and cobalt events may, for example, include the following: undergoing a copper or cobalt deposition step; undergoing an event, such as a fabrication process (e.g., anneal or deposition) or storage in a stocker or cassette, with a copper BEOL lot; and undergoing an event in a tool with a copper or cobalt attribute. As indicated in rows 4 and 5, copper or cobalt contaminated wafer lots may return to a generic BEOL classification upon encapsulation. Typically, encapsulation occurs when further processing steps, such as oxide deposition, are performed on a wafer lot after the deposition of the contaminating metal.

After the event, the wafer lot is typically transported to another tool by a cassette. Block 210 represents selecting a cassette for the wafer lot based on lot attributes and cassette attributes. Again, this typically includes using rules, such as those illustrated in Table 1 above, which define the acceptable cassette types for wafer lot types. In this manner, cassettes and lots are virtually zoned based on cassette and lot attributes. After selecting the cassette, the wafer lot is then stored in the cassette as indicated at block 212. Next, the attributes of the cassette are updated based on the attributes of the stored wafer lot. Typically, the wafer lot received by the cassette passes its attributes to the cassette. An exemplary table illustrating cassette attribute updating will be discussed below.

The above process describes, by way of example and not of limitation, an exemplary flow of a wafer lot through a fabrication facility and the selection of cassettes for the wafer lot based on lot and cassette attributes. This selection process may, in some cases, be pre-empted by a system operator or rules set by the system operator. In such cases, the system operator or rules may select a different type of cassette for a wafer lot than would the cassette management module. For instance, the operator, aware of an upcoming surge in FEOL lots, may select BEOL or BEOL contaminated cassette types for storing FEOL lots.

Figure 3:
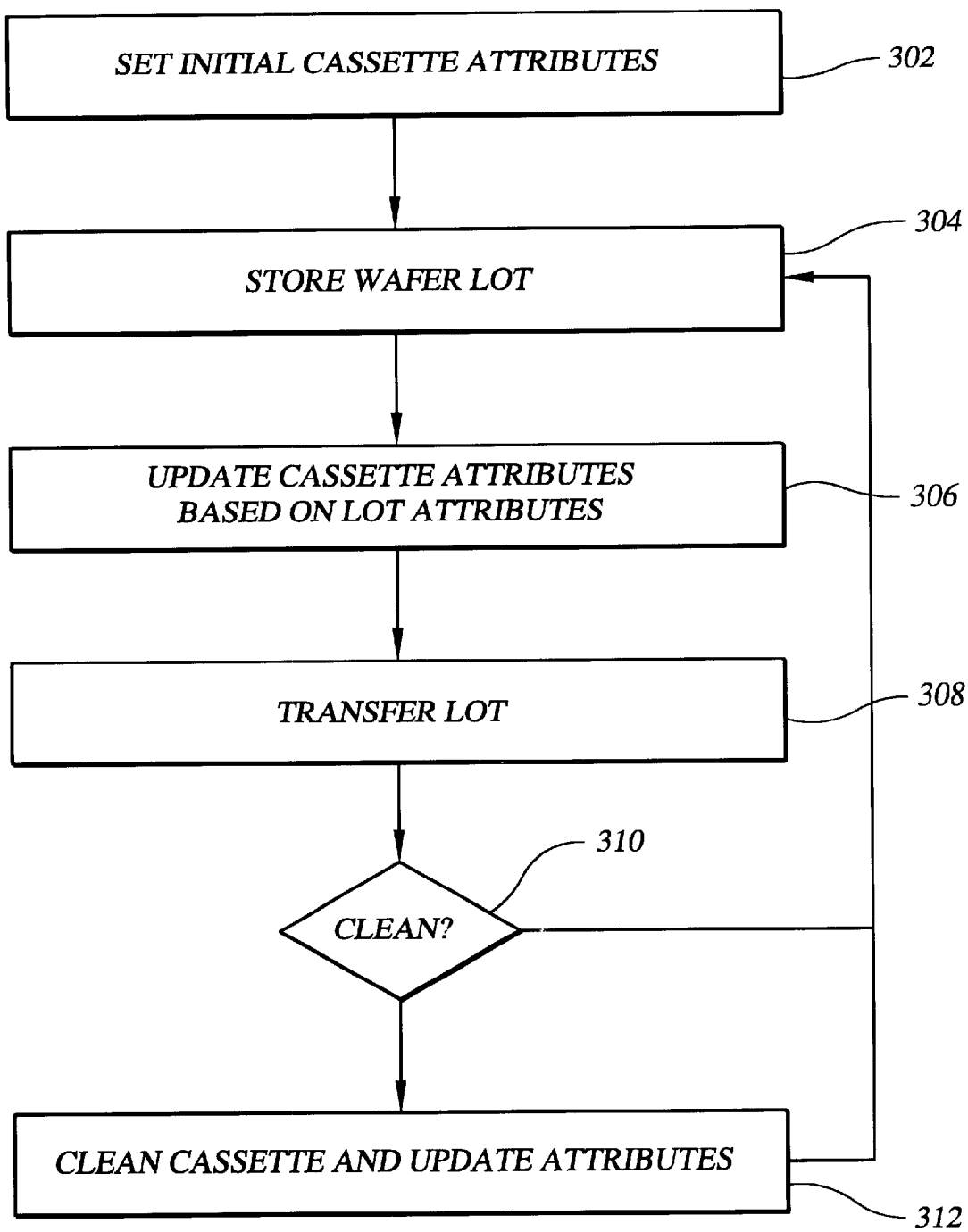
FIG. 3 illustrates an exemplary process in accordance with another embodiment of the invention.

FIG. 3 illustrates an exemplary process flow from the perspective of a cassette. Upon introduction of a new cassette into a facility, a cassette attribute module or system operator sets and stores the initial attributes of the cassette, as indicated at block 302. Typically, a new cassette is defined as an FEOL cassette. Next, the cassette stores one or more wafer lots, as indicated at block 304. This typically includes the cassette management module selecting the cassette using rules, such as those shown in Table 1 above. Alternatively, a system operator may select the cassette. The attributes of the cassette are then selectively updated based on the attributes of the stored wafer lot(s), as indicated at block 306. Table 3 below illustrates exemplary rules for updating a cassette's attributes based on stored wafer lot attributes.

TABLE 3

| Lot Attribute | Initial Cassette Attribute | Final Cassette Attribute |
|---|---|---|
| 1, 0, 0 (FEOL lot) | 1, 0, 0 (FEOL cassette) | 1, 0, 0 (FEOL cassette) |
| 1, 0, 0 (FEOL lot) | 0, 0, 0 (Generic BEOL cassette) | 0, 0, 0 (Generic BEOL cassette) |

TABLE 3-continued

| Lot Attribute | Initial Cassette Attribute | Final Cassette Attribute |
|---|---|---|
| 1, 0, 0 (FEOL lot) | 0, 1, 0 (BEOL copper cassette) | 0, 1, 0 (BEOL copper cassette) |
| 1, 0, 0 (FEOL lot) | 0, 0, 1 (BEOL cobalt cassette) | 0, 0, 1 (BEOL cobalt cassette) |
| 0, 0, 0 (Generic BEOL lot) | 1, 0, 0 (FEOL cassette) | 0, 0, 0 (Generic BEOL cassette) |
| 0, 0, 0 (Generic BEOL lot) | 0,0,0 (Generic BEOL cassette) | 0, 0, 0 (Generic BEOL cassette) |
| 0, 0, 0 (Generic BEOL lot) | 0, 1, 0 (BEOL copper cassette) | 0, 1, 0 (BEOL copper cassette) |
| 0, 0, 0 (Generic BEOL lot) | 0, 0, 1 (BEOL cobalt cassette) | 0, 0, 1 (BEOL cobalt cassette) |
| 0, 1, 0 (BEOL copper lot) | 1, 0, 0 (FEOL cassette) | 0, 1, 0 (BEOL copper cassette) |
| 0, 1, 0 (BEOL copper lot) | 0, 0, 0 (Generic BEOL cassette) | 0, 1, 0 (BEOL copper cassette) |
| 0, 1, 0 (BEOL copper lot) | 0, 1, 0 (BEOL copper cassette) | 0, 1, 0 (BEOL copper cassette) |
| 0, 0, 1 (BEOL cobalt lot) | 1, 0, 0 (FEOL cassette) | 0, 0, 1 (BEOL cobalt cassette) |
| 0, 0, 1 (BEOL cobalt lot) | 0, 0, 0 (Generic BEOL cassette) | 0, 0, 1 (BEOL cobalt cassette) |
| 0, 0, 1 (BEOL cobalt lot) | 0, 0, 1 (BEOL cobalt cassette) | 0, 0, 1 (BEOL cobalt cassette) |

As can be seen the final attributes of the cassette will often mimic the corresponding lot attributes. In other cases, such as with particular contaminates like copper, the cassette attribute of copper will be maintained even if storing a non-copper contaminated lot. However, in such a case the wafer lot will be updated with a copper contamination attribute after storage. The cassette then transfers the lot to a tool, as indicated at block 308. This is typically done under control of the host system.

Cassettes are periodically cleaned. The cassette management module determines whether a cassette needs cleaning, as indicated at block 310. This determination may, for example, be made taking into account the ratio of dirty cassettes to clean cassettes and/or the time of last clean of a cassette. If needed, the cassette is cleaned and its attributes are selectively updated, as indicated at block 312. If cleaning is not needed, control moves to block 304, where the cassette is used for storing and transferring wafer lots. After cleaning, a cassette's attributes may be updated to reflect the cleaning process. In most cases, a cleaned cassette is designated as FEOL and may be used for storing any type of wafer lot. Where the cassette is exposed to a particular contaminant, the contaminated cassette, while cleaned, may maintain an attribute indicating contamination with the contaminant. Table 4 below illustrates, by way of example, the updating of cassettes after cleaning:

TABLE 4

| Initial Cassette Attribute | Final Cassette Attribute |
|---|---|
| 1, 0, 0 (FEOL Cassette) | 1, 0, 0 (FEOL Cassette) |
| 0, 1, 0 (BEOL copper Cassette) | 0, 1, 0 (BEOL copper Cassette) |
| 0, 0, 1 (BEOL cobalt Cassette) | 1, 0, 0 (FEOL Cassette) |
| 0, 0, 0 (Generic BEOL Cassette) | 1, 0, 0 (FEOL Cassette) |

As can be seen, the cassette attribute module may reset all cassettes to FEOL, save those with the copper attribute. In this manner, generic BEOL cassettes and BEOL cobalt cassettes may be reused in FEOL processing, while BEOL copper cassettes are logically restricted to copper lots.

Figure 4:
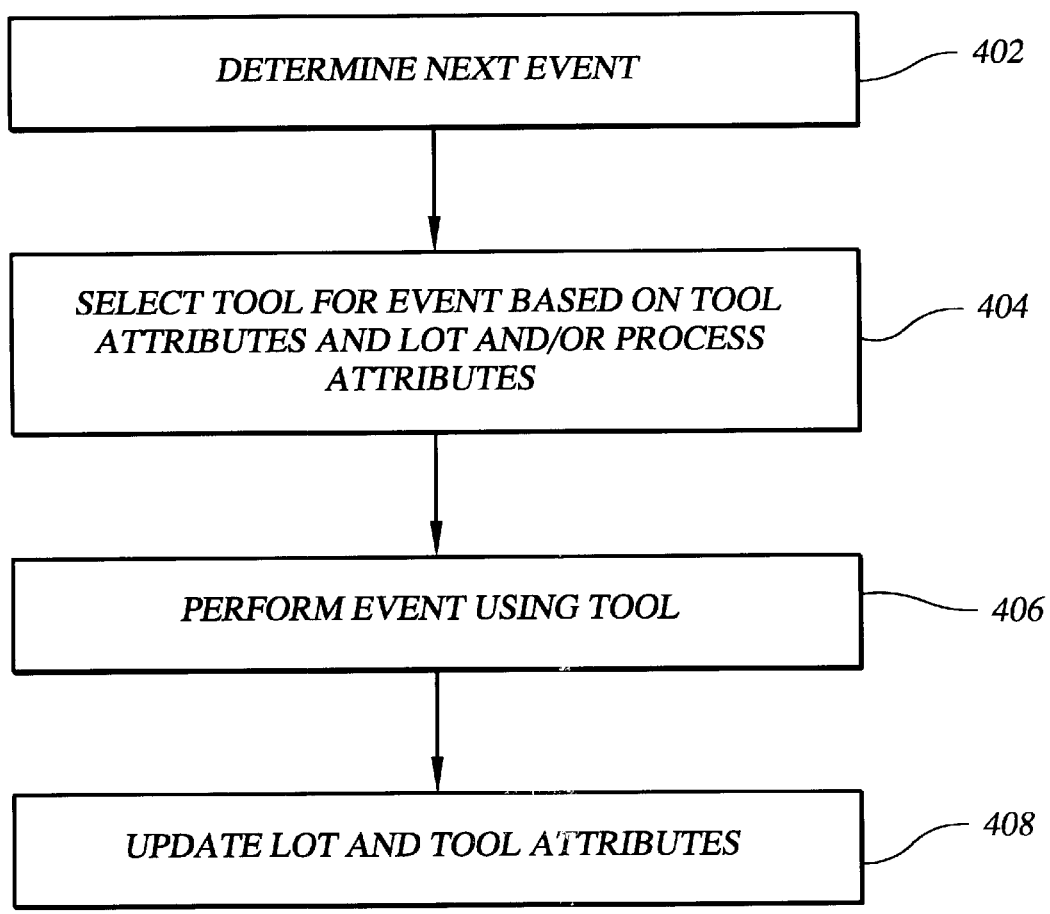
FIG. 4 illustrates an exemplary process in accordance with yet another embodiment of the invention.

In addition to cassette and lot attributes, the system may further maintain tool attributes and intelligently use such attributes to effectuate the manufacturing process. In system 100 above, a tool attribute module and tool management module may be provided for performing these functions. FIG. 4 illustrates an exemplary process flow utilizing tool attributes. At block 402, the host system determines the next event for a wafer lot. This is typically performed by looking at a table defining the wafer lot's fabrication sequence. Next, a tool (e.g., a fabrication tool or a storage tool such as a stocker) is selected, as indicated at block 406. The selection may be based on tool attributes and the attributes of the wafer lot and/or the event to be performed. In some cases, tool selection may be performed by a system operator.

A tool management module may be provided (e.g., on host system 150) which selects tools for events based on wafer lot attributes. The tool management module may, for example, rely on rules defining acceptable tool attributes (maintained by a tool attribute module) for wafer lot attributes to select an appropriate tool. Table 5 below illustrates exemplary rules.

TABLE 5

| Lot Attributes | 1st Acceptable Tool Type | 2nd Acceptable Tool Type | 3rd Acceptable Tool Type | 4th Acceptable Tool Type |
|---|---|---|---|---|
| 1, 0, 0 (FEOL lot) | 1, 0, 0 (FEOL tool) | 0, 0, 0 (Generic BEOL tool) | 0, 1, 0 (BEOL copper tool) | 0, 0, 0 (Generic BEOL tool) |
| 0, 0, 0 (Generic BEOL lot) | 0, 0, 0 (Generic BEOL tool) | 1, 0, 0 (FEOL tool) | 0, 1, 0 (BEOL copper tool) | 0, 0, 1 (BEOL cobalt tool) |
| 0, 1, 0 (BEOL copper lot) | 0, 1, 0 (BEOL copper tool) | 0, 0, 0 (Generic BEOL tool) | 1, 0, 0 (FEOL tool) | 0, 0, 1 (BEOL cobalt tool) |
| 0, 0, 1 (BEOL cobalt lot) | 0, 0, 1 (BEOL cobalt tool) | 0, 0, 0 (Generic BEOL tool) | 1, 0, 0 (FEOL tool) | 0, 1, 0 (BEOL copper tool) |

The tool management module may further take into account lot attributes of a process to be performed by a fabrication tool in selecting a tool for the process. Attributes of each process may be defined by an operator and stored in the memory arrangement. Consider a copper deposition process on a generic BEOL wafer lot. Table 4 indicates that based on wafer attributes alone, a generic BEOL tool would preferably be selected. By taking into account a copper attribute of the fabrication process event, a BEOL copper tool may be selected instead.

The event is then carried out on the wafer lot(s) in the tool, as indicated at block 408. After the event, the attributes of the processed wafer lot(s) and the tool are updated, as indicated at block 410. Wafer lot attributes may be updated in a similar manner as discussed above (e.g., based on other lots in the tool, tool attributes, and process attributes). Table 6 below, while not exhaustive, illustrates exemplary rules for updating a tool.

TABLE 6

| Initial Tool Attributes: | Event | Final Tool Attributes |
|---|---|---|
| 1, 0, 0 (FEOL tool) | BEOL event (e.g., metal deposition) | 0, 0, 0 (Generic BEOL tool) |
| 1, 0, 0 (FEOL tool)) | copper deposition or copper lot in tool | 0, 1, 0 (copper BEOL tool) |
| 1, 0, 0 (FEOL tool) | cobalt deposition or cobalt lot in tool | 0, 0, 1 (cobalt BEOL tool) |
| 0, 0, 0 (Generic BEOL tool) | copper deposition or copper lot in tool | 0, 1, 0 (copper BEOL tool) |

TABLE 6-continued

| Initial Tool Attributes: | Event | Final Tool Attributes |
|---|---|---|
| 0, 0, 0 (Generic BEOL tool) | cobalt deposition or cobalt lot in tool | 0, 0, 1 (cobalt BEOL tool) |

By maintaining tool attributes and selecting tools based on tool and lot attributes, tools can be virtually zoned for specified lots. By further selecting tools based on attributes of the process to be carried out, tools can be zoned by process. This further increases efficiencies of manufacturing.

As noted above, another wafer lot attribute which may be employed is a test/product (T/P) lot attribute which indicates whether a wafer lot is a test lot or a product lot. Similarly, each of the cassettes may be provided with a T/P lot attribute. Based on the T/P lot attribute of a wafer lot, a cassette management module may select cassettes having a corresponding T/P lot attribute for storing and transferring wafer lots. In this manner, cassettes and wafer lots may further be logically zoned into a test lot group and a product lot group. Test lots and product lots may then undergo similar processing in parallel. While the T/P lot attribute of a wafer lot will not change during processing, the T/P lot attribute of a cassette may be changed over the life of the cassette based, for example, on the relative number of test lots to product lots and/or test lot cassettes to product lot cassettes in a facility at a given time.

As noted above, the present invention is applicable to a number of techniques for managing material handling facilities based on material attributes and cassette attributes. Moreover, the term cassette is not limited to any particular type of container. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A method of managing a semiconductor fabrication facility having multiple wafer lots and multiple cassettes for holding the wafer lots, comprising:
    setting one or more lot attributes for each wafer lot;
    setting one or more cassette attributes for each cassette; and
    selecting a particular cassette for holding a particular wafer lot based on the one or more wafer lot attributes of the particular wafer lot and the one or more cassette attributes of the particular cassette.

2. The method of claim 1, wherein setting one or more lot attributes for each wafer lot includes updating the one or more lot attributes for a wafer lot based on an event.

3. The method of claim 2, wherein setting one or more lot attributes for each wafer lot includes updating the one or more lot attributes for a wafer lot based on an attribute of a fabrication tool.

4. The method of claim 1, wherein setting one or more lot attributes includes setting a position attribute based on a position of a wafer lot in a fabrication sequence.

5. The method of claim 1, wherein setting one or more lot attributes includes setting a contaminant attribute based on exposure of a wafer lot to a contaminant.

6. The method of claim 5, further including resetting a contaminant attribute after performing one or more processing steps on the wafer lot after exposure.

7. The method of claim 1, wherein setting one or more lot attributes includes setting a test lot attribute indicating whether a wafer lot is a test lot or a product lot.

8. The method of claim 1, wherein setting one or more cassette attributes includes updating the one or more cassette attributes of a cassette based on one or more lot attributes of a wafer lot stored by the cassette.

9. The method of claim 8, further including cleaning a cassette.

10. The method of claim 1, further including setting one or more tool attributes of a tool based on one or more lot attributes of a wafer lot used by the tool.

11. The method of claim 10 wherein the tool is a storage tool.

12. The method of claim 10, wherein the tool is a fabrication tool.

13. The method of claim 12, further including setting a tool attribute of the fabrication tool based on a fabrication process performed by the fabrication tool.

14. The method of claim of claim 10, further including selecting a tool for performing a fabrication process on a wafer lot based on the one or more lot attributes of the wafer lot.

15. The method of claim 14, wherein selection of the tool is based upon one or more attributes of the fabrication process.

16. A method of managing a semiconductor fabrication facility having multiple wager lots and multiple cassettes for holding the wafer lots, comprising:
    setting one or more lot attributes for each wafer lot;
    setting one or more cassette attributes for each cassette, including updating the one or more attributes of a cassette based on one or more lot attributes of a wafer lot stored by the cassette;
    selecting a particular cassette for holding a particular wafer lot based on the one or more wafer lot attributes of the particular wafer lot and the one or more cassette attributes of the particular cassette;
    cleaning a cassette; and
    selectively updating one or more lot attributes of the cleaned cassette after cleaning.

17. The method of claim 16, wherein selectively updating the one or more lot attributes of the cleaned cassette after cleaning includes maintaining an attribute identifying a particular contaminant.

18. A system for managing a semiconductor fabrication facility having multiple wafer lots and multiple cassettes for holding the wafer lots, comprising:
    a memory arrangement for storing wafer lot attributes and cassette attributes;
    a wafer attribute module, communicatively coupled to the memory arrangement, for setting one or more lot attributes for each wafer lot;
    a cassette attribute module, communicatively coupled to the memory arrangement, for setting one or more cassette attributes for each cassette; and
    a cassette management module, communicatively coupled to the memory arrangement, for selecting a particular cassette for holding a particular wafer lot based on the one or more wafer lot attributes of the particular wafer lot and the one or more cassette attributes of the particular cassette.

19. The system of claim 18, wherein the wafer attribute module sets one or more lot attributes by updating the one or more lot attributes for a wafer lot based on an event.

20. The system of claim 19, wherein the wafer attribute module sets one or more lot attributes by updating the one or more lot attributes for a wafer lot based on an attribute of a fabrication tool.

21. The system of claim 18, wherein the wafer attribute module sets one or more lot attributes by setting a position attribute based on a position of a wafer lot in a fabrication sequence.

22. The system of claim 18, wherein the wafer attribute module sets one or more lot attributes by setting a contaminant attribute based on exposure of a wafer lot to a contaminant.

23. The system of claim 22, wherein the wafer attribute module resets a contaminant attribute after one or more processing steps are performed on the wafer lot after exposure.

24. The system of claim 18, wherein the wafer attribute module sets one or more lot attributes by setting a test lot attribute indicating whether a wafer lot is a test lot or a product lot.

25. The system of claim 18, wherein the cassette attribute module sets one or more cassette attributes by updating the one or more cassette attributes of a cassette based on one or more lot attributes of a wafer lot stored by the cassette.

26. The system of claim 18, further including a tool attribute module for setting one or more tool attributes of a tool based on one or more lot attributes of a wafer lot used by the tool.

27. The system of claim 26, wherein the tool attribute module sets a tool attribute of a fabrication tool based on a fabrication process performed by the fabrication tool.

28. The system of claim of claim 26, further including a tool management module for selecting a tool for performing a fabrication process on a wafer lot based on the one or more lot attributes of the wafer lot.

29. The system of claim 28, herein the tool management module selects the tool based upon one or more attributes of the fabrication process.

30. A system of managing a semiconductor fabrication facility having multiple wafer lots and multiple cassettes for holding the wafer lots, comprising:

a memory arrangement for storing wafer lot attributes and cassette attributes;

a wafer attribute module, communicatively coupled to the memory arrangement, for setting one or more lot attributes for each wafer lot;

a cassette attribute module, communicatively coupled to the memory arrangement, and for setting one or more cassette attributes for each cassette; and a cassette management module, communicatively coupled to the memory arrangement, for selecting a particular cassette for holding a particular wafer lot based on the one or more wafer lot attributes of the particular wafer lot and the one or more cassette attributes of the particular cassette; wherein the cassette attribute module selectively updates one or more lot attributes of the cassette after the cassette is cleaned.

31. The system of claim 30, wherein the cassette attribute module selectively updates the one or more lot attributes of the cassette after the cassette is cleaned by maintaining an attribute identifying a particular contaminant.

32. A method of managing an automated material handling system having multiple material items and multiple cassettes for holding the material items, comprising:

setting one or more lot attributes for each material item;

setting one or more cassette attributes for each cassette; and selecting a particular cassette for holding a particular material item based on the one or more material item attributes of the particular material item and the one or more cassette attributes of the particular cassette.

33. A system for managing an automated material handling system having multiple material items and multiple cassettes for holding the material items, comprising:

a memory arrangement for storing material item attributes and cassette attributes;

a module, communicatively coupled to the memory arrangement, for setting one or more material item attributes for each material item;

a cassette attribute module, communicatively coupled to the memory arrangement, for setting one or more cassette attributes for each cassette; and a cassette management module, communicatively coupled to the memory arrangement, for selecting a particular cassette for holding a particular material item based on the one or more material item attributes of the particular material item and the one or more cassette attributes of the particular cassette.

* * * * *

UNITED STATES PATENT AND TRADEMARK OFFICE
CERTIFICATE OF CORRECTION

PATENT NO.   : 6,449,522 B1
DATED        : September 10, 2002
INVENTOR(S)  : Conboy et al.

It is certified that error appears in the above-identified patent and that said Letters Patent is hereby corrected as shown below:

<u>Title page,</u>
Item [73], the Assignee's name should read -- Advanced Micro Devices, Inc., Sunnyvale, CA (US) --.

Signed and Sealed this

Eighth Day of April, 2003

JAMES E. ROGAN
*Director of the United States Patent and Trademark Office*